United States Patent
Lee et al.

(10) Patent No.: US 6,507,522 B2
(45) Date of Patent: Jan. 14, 2003

(54) METHOD FOR ERASING MEMORY CELLS IN A NONVOLATILE MEMORY

(75) Inventors: Joon-Sung Lee, Seoul (KR); Chan-Jo Lee, Seoul (KR); Yun-Heub Song, Suwon (KR); Seung-Keun Lee, Kyunggi-do (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/841,917

(22) Filed: Apr. 24, 2001

(65) Prior Publication Data

US 2001/0043492 A1 Nov. 22, 2001

(30) Foreign Application Priority Data

Apr. 24, 2000 (KR) .............................................. 00-21646
Dec. 14, 2000 (KR) .............................................. 00-76373

(51) Int. Cl.[7] .............................................. G11C 16/04
(52) U.S. Cl. .............................. 365/185.3; 365/185.22; 365/185.29
(58) Field of Search .......................... 365/185.3, 185.22, 365/185.29, 185.01

(56) References Cited

U.S. PATENT DOCUMENTS

| | | | | |
|---|---|---|---|---|
| 5,844,847 A | * | 12/1998 | Kobatake | 365/185.24 |
| 5,991,206 A | * | 11/1999 | Shin | 365/185.22 |
| 5,999,446 A | * | 12/1999 | Harari et al. | 365/185.03 |
| 6,049,486 A | * | 4/2000 | Lee et al. | 365/185.26 |

* cited by examiner

Primary Examiner—Hoai Ho
(74) Attorney, Agent, or Firm—Marger Johnson & McCollom, P.C.

(57) ABSTRACT

A method for managing memory cells in a nonvolatile memory, such as a flash memory, includes detecting and intermediately programming fast-erased memory cells. All of the memory cells in a sector can then be erased.

20 Claims, 12 Drawing Sheets

METHOD FOR ERASING MEMORY CELLS IN A NONVOLATILE MEMORY

This application relies for priority upon Korean Patent Application No. 2000-21646, filed on Apr. 24, 2000 and Korean Patent Application No. 2000-76373, filed on Dec. 14, 2000, the contents of which are herein incorporated by reference in their entirety.

FIELD OF THE INVENTION

The present invention relates generally to a flash memory, and more specifically to the optimization of threshold voltage distribution profiles of erased memory cells in a flash memory.

BACKGROUND OF THE INVENTION

Flash memories, including electrically erasable and programmable read only memories (EEPROMs), offer advanced performance in reading and writing (or programming) data, as compared to other kinds of nonvolatile memories. Because of its high speed operation, flash memory is the preferred memory device for portable computing devices, cellular phones, digital still cameras, and similar equipment. A typical flash memory includes a plurality of memory cells formed in a matrix of rows and columns. Erasing the memory cells is generally performed for an entire memory cell array, called a block or sector, at the same time. Programming can be conducted for one or more memory cells at a time.

FIG. 1 illustrates a conventional flash memory cell. Referring to FIG. 1, a conventional flash memory cell includes a floating gate transistor 10 constructed of a source 14, a drain 16, a floating gate 22, and a control gate 26. The floating gate 22 is deposited on an oxide film 20 on a channel region 18 in a bulk substrate 12, and overlaps edges of the source 14 and drain 16 regions. The control gate 26 is formed over the floating gate 22. An intermediate insulation layer 24 is interposed between the control gate 26 and the floating gate 22 to isolate the gate layers. This intermediate insulation layer 24 may be formed, for example, of O—N—O (oxide-nitride-oxide).

In the flash memory, the control gates 26 of each of the various transistors 10 arranged in a row are connected to the same wordline in common. Similarly, the drain regions 16 of each of the transistors 10 arranged in a column are connected to the same bitline in common. The source regions 14 of each of the transistors 10 in the flash memory are connected to a common source line in common.

A typical programming operation in a flash memory device is accomplished by inducing a hot electron injection from the channel region 18, nearby the drain 16, to the floating gate 22. In order to cause the hot electron injection, the source 14 and substrate (or bulk) 12 are held at ground potential, while the control gate 26 is connected to a high positive voltage (Vg) of about 10V and the drain 16 is biased with a voltage of about 5~6V. A memory cell programmed in the manner just described has negative charges in its floating gate 22. This, in turn, increases its threshold voltage during a read operation.

In a read operation, the drain 16 is provided with a voltage of about 1V, while the control gate 26 is connected to a power supply voltage (i.e., about 5V) and the source is connected to 0V. Since the increased threshold voltage of the programmed memory cell acts as a blocking potential on the gate voltage during a read-out operation, the programmed cell is considered to be an "off" cell. The programmed (or "off") cell, typically has a threshold voltage of between 6V and 8V, as indicated by the Programmed State voltage distribution profile shown in FIG. 2.

Erasing a flash memory cell is accomplished using the F-N (Fowler-Nordheim) tunneling effect. During an erasing operation, the control gate 26 is coupled to a high negative voltage of about −8V, and the substrate (or bulk) 12 is connected to a high positive voltage of about 8~10V in order to induce the tunneling therebetween. Meanwhile, the drain 16 is conditioned at a high impedance state (or a floating state). A strong electric field is induced by the difference in voltage bias conditions between the control gate 26 and bulk region 12. This electric field causes electrons to be moved into the source 14. F-N tunneling normally occurs when an electric field of around 6~7MV/cm is developed across the thin insulating film 20 between the floating gate 22 and bulk region 12. The thin insulating film 20 separating the floating gate 22 and bulk region 12 typically has a thickness of less than 100 Å. The erased cell has a lower threshold voltage, typically between about 1~3V, and is therefore sensed as an "on" cell during a read operation.

In a typical flash memory cell array architecture, the bulk region (or substrate) 12 combines active regions of multiple memory cells, so that each of the memory cells formed in the same bulk region 12 are spontaneously erased at the same time. A unit of memory cells erased by a single erase operation is called a sector (or block). Sectors are configured by separating the bulk region. Each sector typically contains memory cells providing about 64K of memory.

Table 1 shows the different bias voltage levels applied to each of the various regions of a flash memory cell during the programming, erasing, and reading operation modes. In Table 1, control gate voltage is represented by Vg, drain voltage is represented by Vd, source voltage is represented by Vs, and bulk voltage is represented by Vb.

TABLE 1

| Operation Mode | Vg | Vd | Vs | Vb |
|---|---|---|---|---|
| Programming | 10 V | 5–6 V | 0 V | −0.5–0 V |
| Erasing | −8 V | Floating | floating | 8–10 V |
| Reading | 5.5 V | 1 V | 0 V | 0 V |

The control gate voltage Vg is supplied by a row decoder in the flash memory device. As shown in the table 1, the control gate voltage Vg varies according to the operation mode. Varying the control gate voltage Vg helps form the basic biasing conditions that establish the states of a selected memory cell. Control gate voltage Vg must be stabilized to secure reliability for the various operations.

Unfortunately, some problems exist with respect to the use of flash memories. FIG. 2 is a graph illustrating threshold voltage distribution profiles for a Programmed State and an Erased State of a flash memory. Referring to FIG. 2, after a conventional erasing operation has been performed on a block of memory cells, a group of those memory cells may have threshold voltages below a minimum desired threshold voltage value (e.g., 1V) representing an erasure state. The shaded region of the Erased State voltage distribution profile indicates the number of cells in this over-erased state and the undesirably low threshold voltage region in which they lie.

Over-erased cells can result from a difference in erasing speeds between the various memory cells belonging to a sector. In general, the erasing speed depends on a coupling ratio R. The coupling ratio R is determined by a relationship between a first capacitance $C_{ono}$, between the floating gate 22 and the control gate 26, and a second capacitance $C_{tunnel}$, between the floating gate 22 and channel region 18. This ratio is determined according to the following equation:

$$R=C_{ono}/(C_{ono}+C_{tunnel})$$

The first capacitance $C_{ono}$ is variable with the topology of the floating gate 22 and the thickness of the intermediate O—N—O insulation film layer 24. The second capacitance $C_{tunnel}$ is affected by the thickness of the tunnel oxide film 20 and the width of the channel region 18. Ensuring the uniformity of both the tunnel oxide thickness and the width of the channel region 18 is important because the second capacitance $C_{tunnel}$ has a significant effect on the coupling ratio. Providing uniformity between channel widths would significantly reduce over-erasing of the memory cells. Current manufacturing facilities, however, have been unable to sufficiently narrow or control channel width to overcome the problem of over-erasing., and uneven erasing speeds resulting in over-erased memory cells are therefore common.

The width of a threshold voltage distribution profile is called its "active width." As can be seen from the Erased State voltage distribution profile of FIG. 2, the presence of over-erased cells results in a wider distribution profile along the axis of threshold voltage (i.e., an increased active width). The active width of the Erased State voltage distribution profile is therefore directly related to the problem of over-erased memory cells, and correcting the problems from over-erasing of memory cells can be achieved by other means of narrowing the active width.

"Pre-programming" and "post-programming" are prior art methods of reducing the active width of a memory cell by preventing or curing over-erased memory cells. Under-programmed memory cells are programmed cells having threshold voltages below a predetermined minimum program voltage (e.g., 6V). In pre-programming, under-programmed cells are re-programmed until their voltages are at least above the minimum desired level. In post-programming, over-erased cells are cured by raising their threshold voltages above the lowest desired erased state voltage (e.g., 1V).

FIG. 3 is a flow chart illustrating a prior art erasure operation including both a pre-programming and post-programming step. Referring to FIG. 3, the erasure operation begins with a Pre-Program step to ensure that all programmed cells have a voltage above the minimum program voltage. The Main Erasure step is then carried out to erase each of the memory cells in the desired sector. After this main erasing step is completed, post-programming is carried out to correct any over-erased cells. Pre-programming and post programming are performed using the program bias voltages shown in Table 1.

The pre-programming step is outlined in more detail by the flow chart in FIG. 4. Referring to FIG. 4, during the pre-programming step, a programmed cell is put into a checking step S10 to verify whether it is positioned within a predetermined program state or not. If the threshold voltage of the programmed cell is less than the minimum voltage (e.g., 6V) established for a program state, a further programming operation S12 is performed for the under-programmed cell. This programming operation S12 repeats itself until the voltage is above the minimum established level. When the threshold voltage of the programmed cell reaches at least the minimum level, the pre-programming steps are then conducted for the next programmed cell. The pre-programming operation is terminated when the last programmed cell is verified as being programmed completely. After finishing the pre-programming operation, each of the programmed cells should have a threshold voltage equal to or greater than the minimum program voltage, and should thus be established as an "off" cell. The main erasing operation can then proceed.

FIG. 5 is a flow diagram illustrating the basic steps of the main erasure operation. Referring FIG. 5, the main erasing operation includes an erasing step S20 and a verifying step S22, which repeat themselves until all of the memory cells have threshold voltages of less than 3V. More specifically, an erasing operation S20 is performed on all of the cells in a sector using the biasing voltages shown in Table 1. An erasing verification operation S22 is then performed to ensure that each of the memory cell threshold voltages is below the maximum allowable voltage (e.g., 3V) for an erased memory cell. If any of the memory cells in the sector has a voltage higher than the maximum allowable level, the erasing step is performed again on all of the cells in the sector. Only after all of the memory cells are verified as having threshold voltages less than the maximum erased voltage level does the process proceed to the next step.

Referring again to FIG. 3, after the pre-programming and main erasing steps are completed, due to the remaining possibility of over-erased memory cells, a post-programming step must be carried out as well. In the post-programming step, the sources 14 and bulk 12 of erased cells are grounded, the control gates 26 are connected to a program voltage (10V), and the drains 16 are connected to a voltage of about 5~6V. The post-programming operation is generally the same as the pre-programming operation shown in FIG. 4, except that the electric field induced between the floating gate 22 and the channel region 18 during post-programming is weaker than that induced during pre-programming. Charges smaller than those of the pre-programming step are therefore settled into the floating gates 22 during post-programming.

Although the use of the pre-programming and post-programming steps in this method reduces the number of over-erased cells, the possibility of over-erased memory cells still exists. This is because the verification loop causes the erasing process to repeat erasing all of the cells in the sector even if only one of those memory cells is above the highest allowable erase threshold voltage. In other words, the erasing operation is repeated on all of the memory cells until the last one reaches a threshold voltage below the highest allowable erased voltage level. Thus, because memory cells with a higher coupling ratio R are erased faster than memory cells having a smaller ratio, the cells with higher ratios may become over-erased through repeated erasing operations. The greater the difference in erasure speeds between cells in a sector, the wider the active width of the distribution profile for that sector will be.

Specifically, through repeated erasing operations during the main erasure step, the fast-erased cells become situated in the low threshold voltage region, as represented by the shaded area of the Erased State distribution profile in FIG. 2. This low voltage region, or over-erased state, can be defined as below 0V or as below the minimum voltage level for an erased cell (e.g., 1V). Over-erasure can cause a read-out fail during a program verifying operation because the over-erased cells may be detected as an "on" cell due to the low threshold voltages.

Further, during post-programming, when a voltage of 5~6V is applied to the drain 16 of a selected memory cell, the floating gate voltage Vf (where Vf=Rd×Vd) of a non-selected memory cell belonging to the column containing the selected memory cell is increased according to a drain coupling ratio Rd (where $Rd=C_{drain}/(C_{ono}+C_{tunnel})$). If the floating gate voltage Vf is above a threshold voltage Vfg of the non-selected memory cell, an abnormal conductive state, called "program fail" or "drain turn-on", arises in the non-selected memory cell. This drain turn-on effect can make the post-programming operation unavailable entirely or it can slow the post-programming operation down substantially. This phenomenon therefore serves as an important factor in determining the minimum value of the erased threshold voltages in the distribution profile.

SUMMARY OF THE INVENTION

The various aspects and embodiments of the present invention are intended to solve the foregoing problems.

One object is to provide a method of erasing memory cells that results in threshold voltages defined in a narrower active range.

It is another object to provide a method of erasing memory cells with erasing speeds that are uniformly controlled.

It is another object to provide a method of erasing memory cells with a shortened erasure time.

In order to accomplish these objects, a preferred method of erasing memory cells according to this invention begins by performing a first erasing operation on the memory cells and then determining which of the memory cells have threshold voltages less than a check voltage. Those cells with threshold voltages below the check voltage are identified as fast-erased memory cells. The fast-erased memory cells are then programmed to increase their threshold voltages. And finally, a main erasing operation is performed on all of the memory cells.

In other words, in the preferred method, a programming operation is performed on fast-erased memory cells during an erasure period. The identifying and programming of fast-erased cells increases the threshold voltages of those cells which would otherwise be regarded to as over-erased cells at the end of the erasure operation. By increasing the threshold voltages of the fast-erased cells, the uniformity of the erased threshold voltage distribution profile is enhanced.

BRIEF DESCRIPTION OF THE DRAWINGS

A greater understanding of the features and advantages of the present invention may be realized by the following detailed description of preferred embodiments made with reference to the accompanying drawings, in which.

DETAILED DESCRIPTION OF PREFERRED EMBODIMENTS

Figure 1:
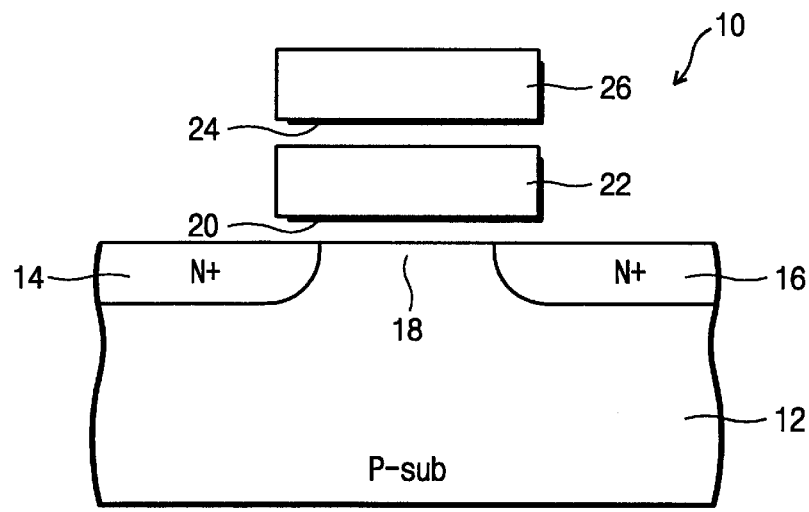
FIG. 1 is a cross-sectional view of a memory cell in a conventional flash memory, showing a vertical structure thereof.
Figure 2:
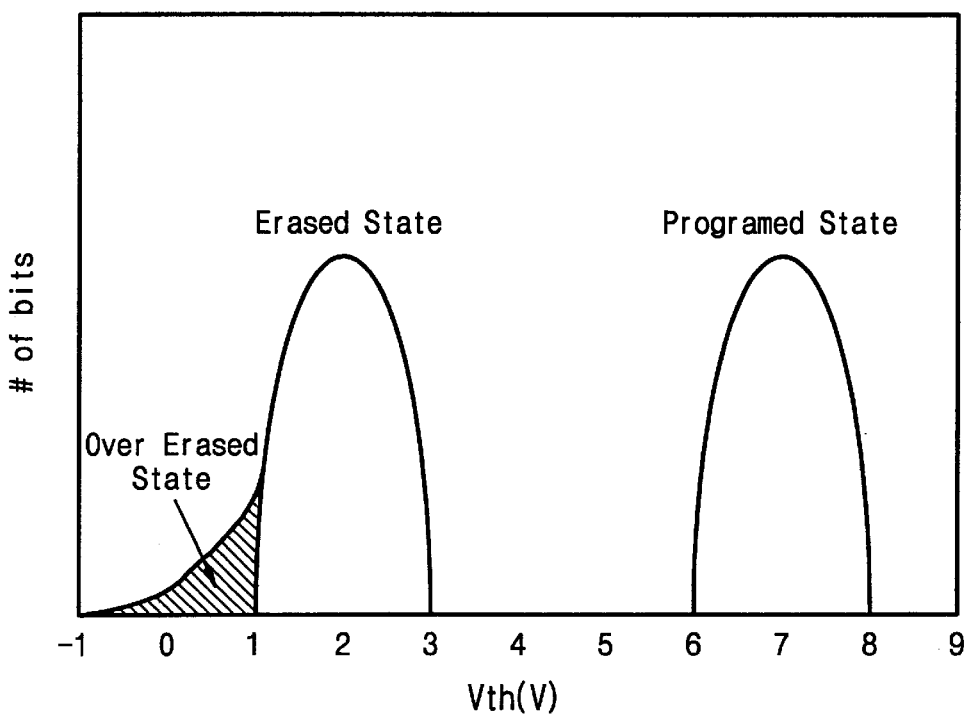
FIG. 2 is a graph illustrating threshold voltage distribution profiles of flash memory cells after erasing and programming operations, according to the prior art.
Figure 3:
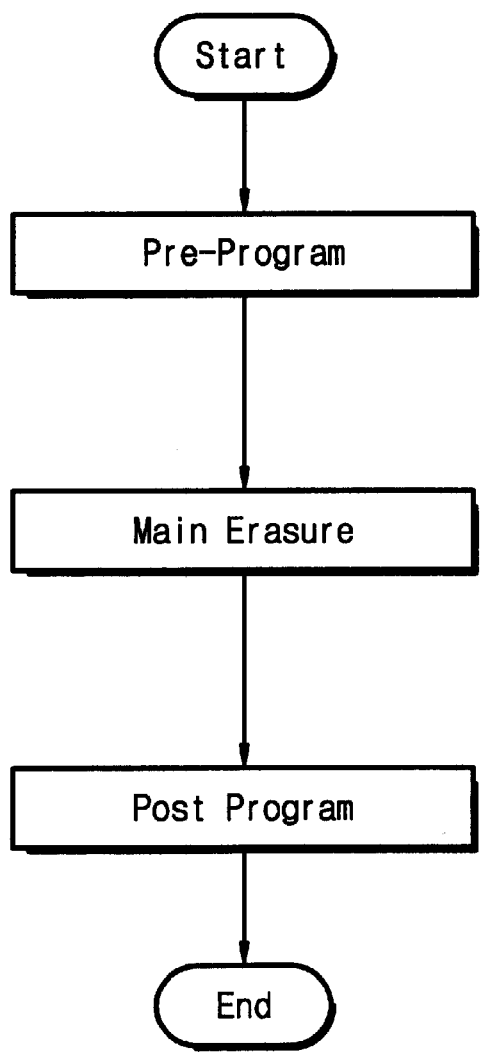
FIG. 3 is a flow chart illustrating a conventional erasure method, further showing threshold voltage distribution profiles of flash memory cells during each of the steps of the erasure method, according to the prior art.
Figure 3:
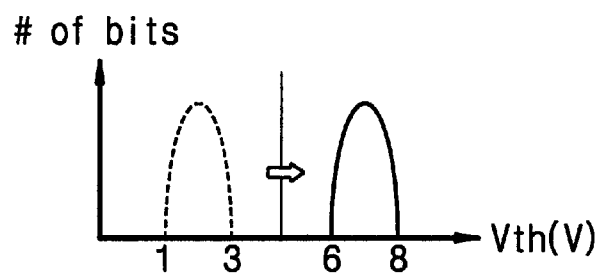
Figure 3:
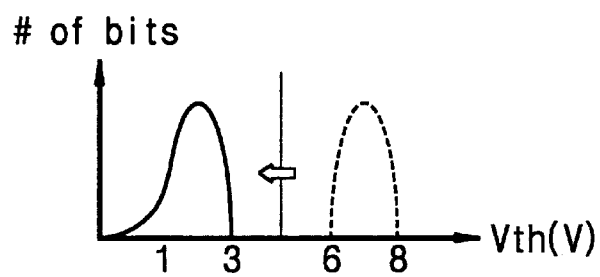
Figure 3:
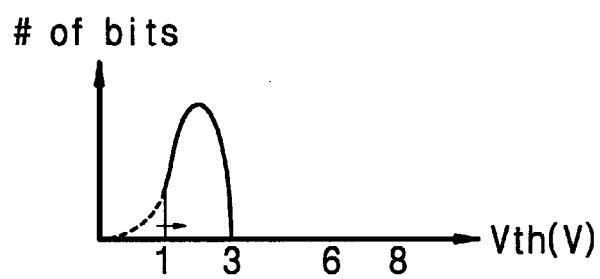
Figure 4:
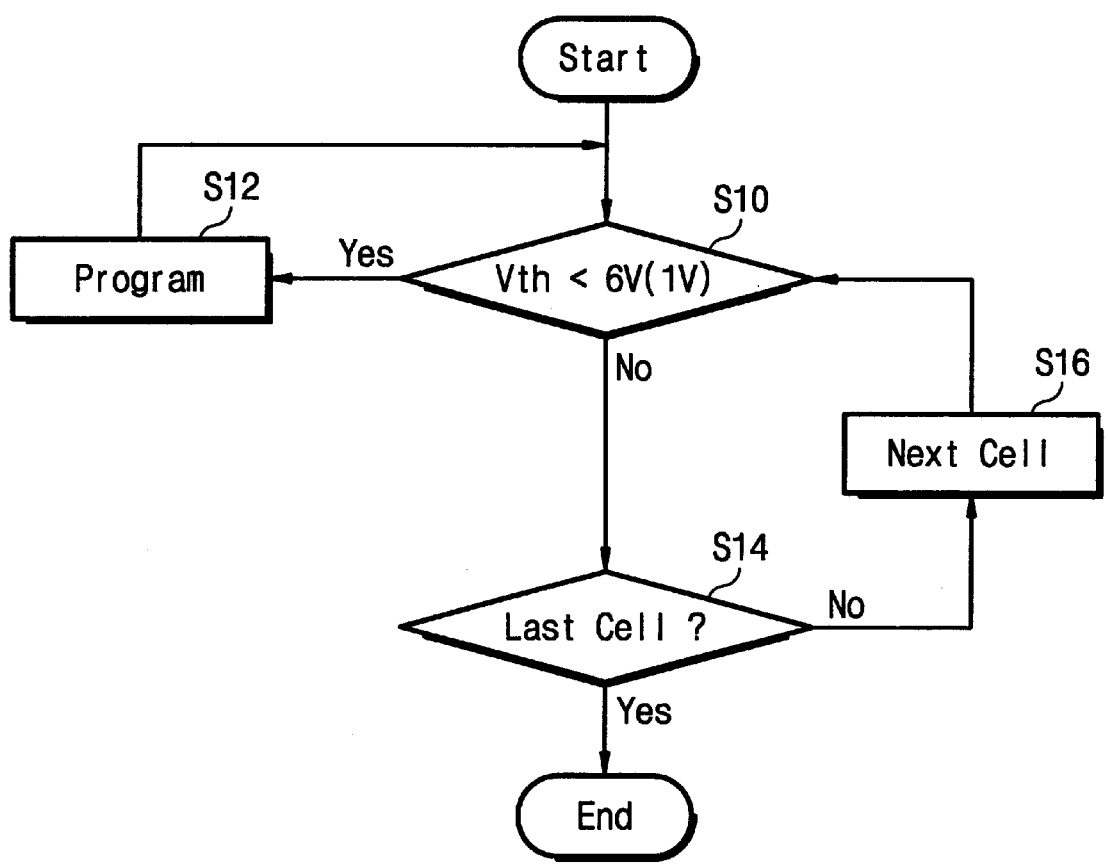
FIG. 4 is a flow diagram illustrating the pre-programming and post-programming operations of the erasure method illustrated in FIG. 3.
Figure 5:
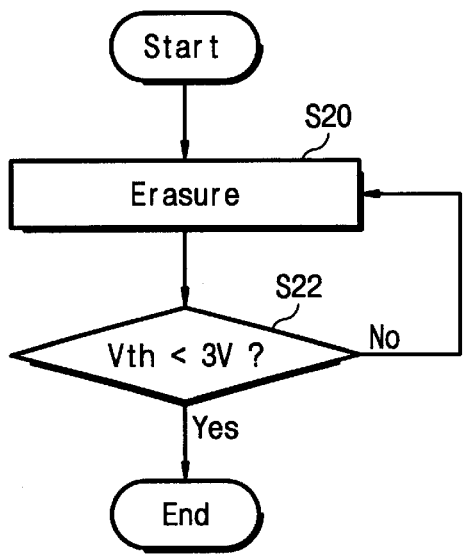
FIG. 5 is a flow diagram illustrating the main erasure operation of the erasure method shown in FIG. 3.

The flash memory device utilized in the preferred embodiment of the present invention is a NOR-type flash memory device having a plurality of sectors. Each sector is formed of a plurality of floating gate transistor memory cells, such as the cell illustrated in FIG. 1. Since the memory cells in a given sector have varying coupling ratios R between themselves, their erasing speeds also vary from each other, thereby causing a wider active width for the erased threshold voltage distribution profile.

Figure 11:
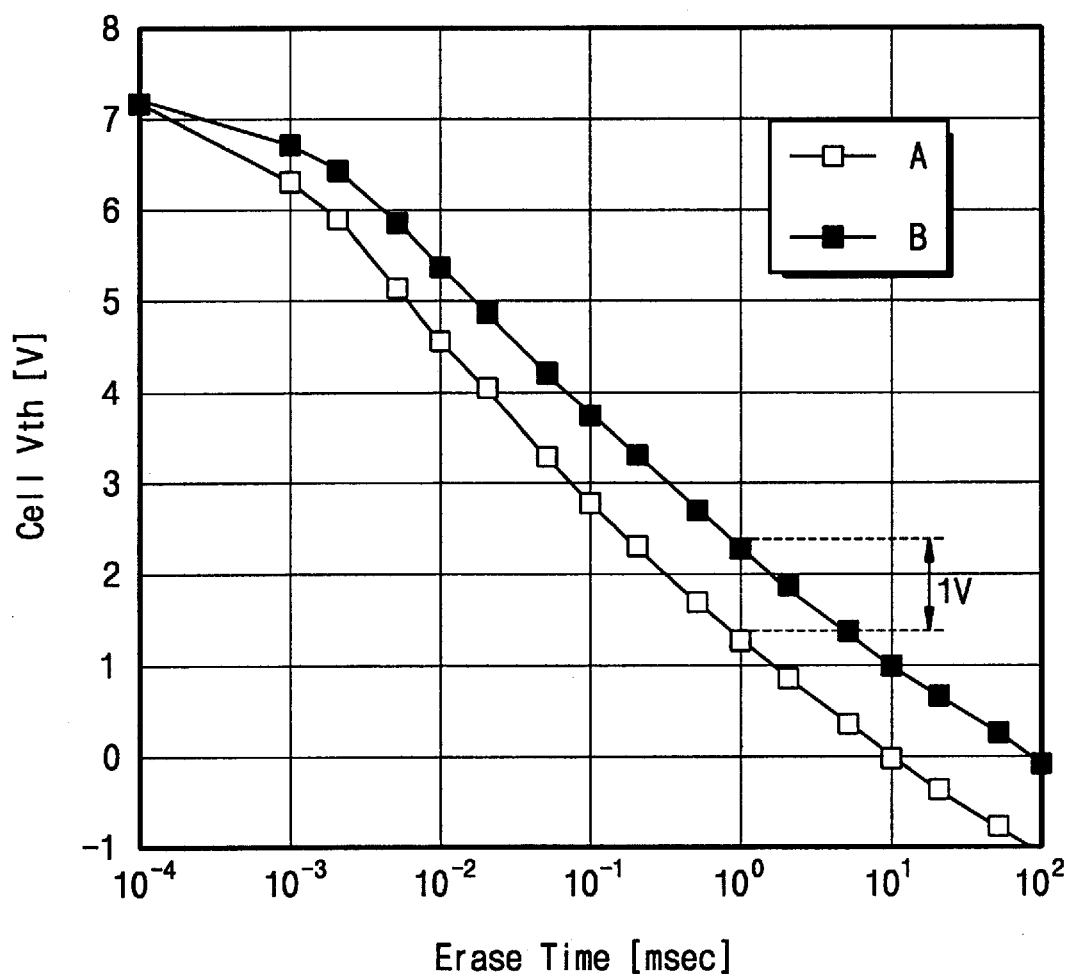
FIG. 11 is a graph showing the relationship between erasure time and threshold voltage during an erasure operation on memory cells having differing erasing speeds.

Referring to FIG. 11, after the same erasure time, a fast-erased cell A has a lower threshold voltage than a slow-erased cell B. The difference between the erased threshold voltages of the two types of cells is directly proportional to the difference in erasing speeds between them. For example, with respect to the cells illustrated, the threshold voltage of the fast-erased cell A becomes about half that of the slow-erased cell B after an erasure time of 1 ms (millisecond). In the preferred embodiment of the present invention, unifying these threshold voltage levels for all of the erased memory cells in a sector is accomplished by increasing the threshold voltages of the fast-erased cells, while holding the threshold voltage of the slow-erased cells constant. A shortened erasure time can also be provided. These aspects will be discussed in greater detail below.

Figure 6:
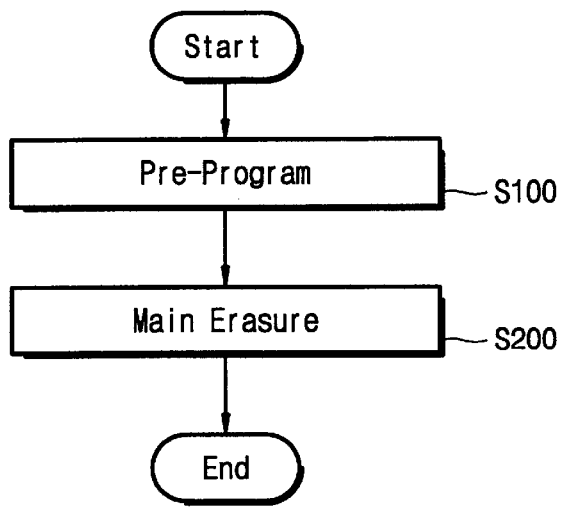
FIG. 6 is a flow chart illustrating an erasure method according to a preferred embodiment of the present invention.

Referring to FIG. 6, according to the preferred erasure method of this invention, the erasing sequence includes a Pre-Program step S100 and a Main Erasure step S200. Pre-programming is performed to prevent memory cells from becoming over-erased during the main erasing. The biasing voltages for the Pre-Program operation S100 are the same as those shown in Table 1 for the programming operation mode.

The Pre-Program step S100 begins with a program verifying operation to determine whether a selected memory cell is established in a program state. Mis-programmed cells are repeatedly put through programming and verifying steps until they have threshold voltages above a minimum desired program voltage. A desired program state, for example, may require a cell threshold voltage of at least 6V.

Figure 7:
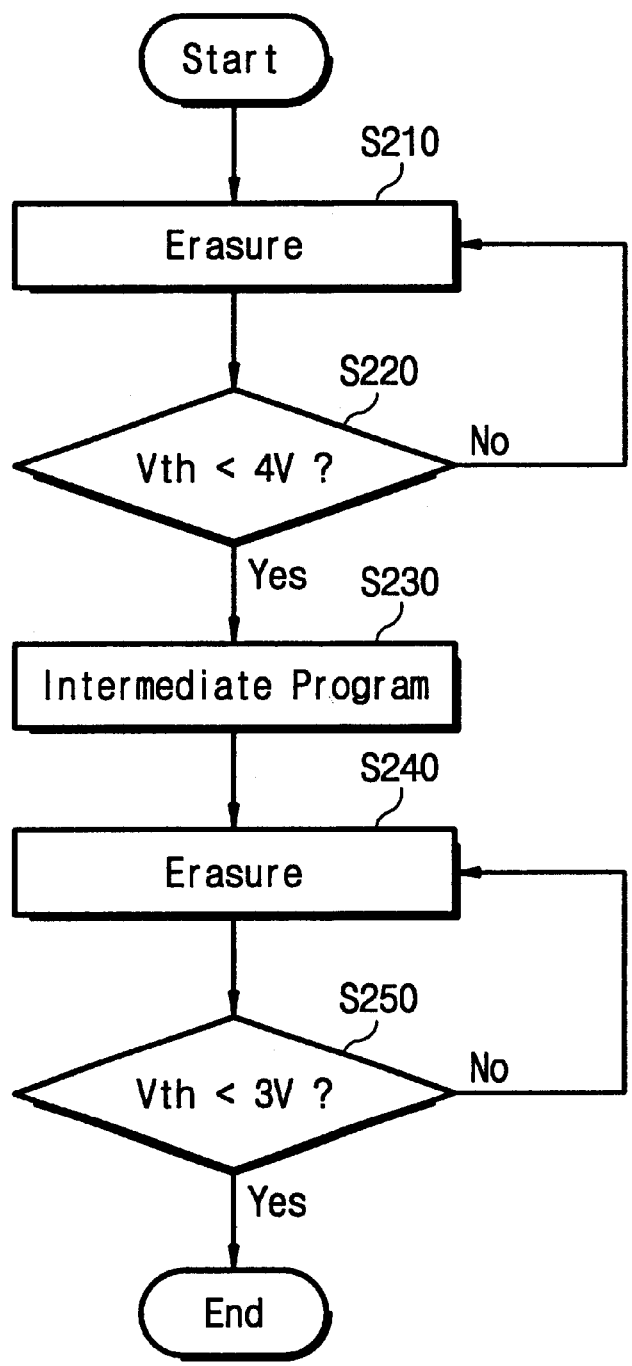
FIG. 7 is a flow chart illustrating the main erasure operation of the erasure method shown in FIG. 6.
Figure 9A:
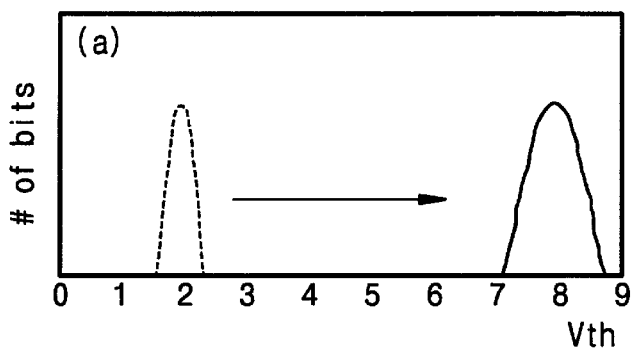
FIGS. 9A–9D are graphs showing threshold voltage distribution profiles of memory cells after programming and erasing operations conducted according to the method of FIG. 6.
Figure 9B:
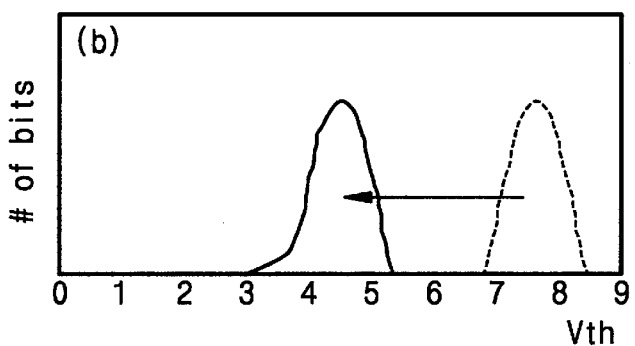
Figure 10A:
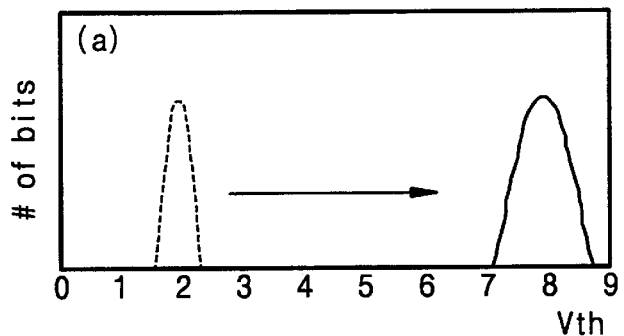
FIGS. 10A–10D are graphs showing threshold voltage distribution profiles of memory cells after programming and erasing operations conducted according to the method of FIG. 6.
Figure 10B:
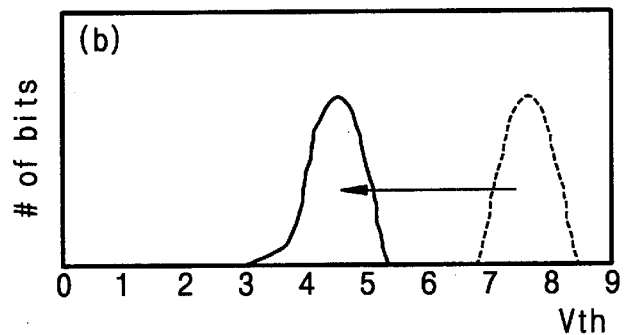

The Main Erasure step S200 follows pre-programming. Referring to FIG. 7, the Main Erasure step S200 includes a first Erasure step S210, an Intermediate Program step S230, and a second Erasure step S240. During the first Erasure step S210, all of the memory cells of a selected sector are erased simultaneously. A verification step S220 then determines which erased cells have threshold voltages less than a predetermined check voltage (e.g., 4V). A distribution profile of the threshold voltages after the first erasing operation S210 is shown in FIGS. 9B and 10B.

The check voltage is a reference voltage for identifying memory cells that have fast erasure times relative to the other cells in a sector. The value of the check voltage can be varied, as desired, according to the characteristics of a particular flash memory device. Memory cells with threshold voltages below the check voltage, following the first erasing operation, are considered fast-erased cells relative to those memory cells whose threshold voltages are above the check voltage.

Figure 8A:
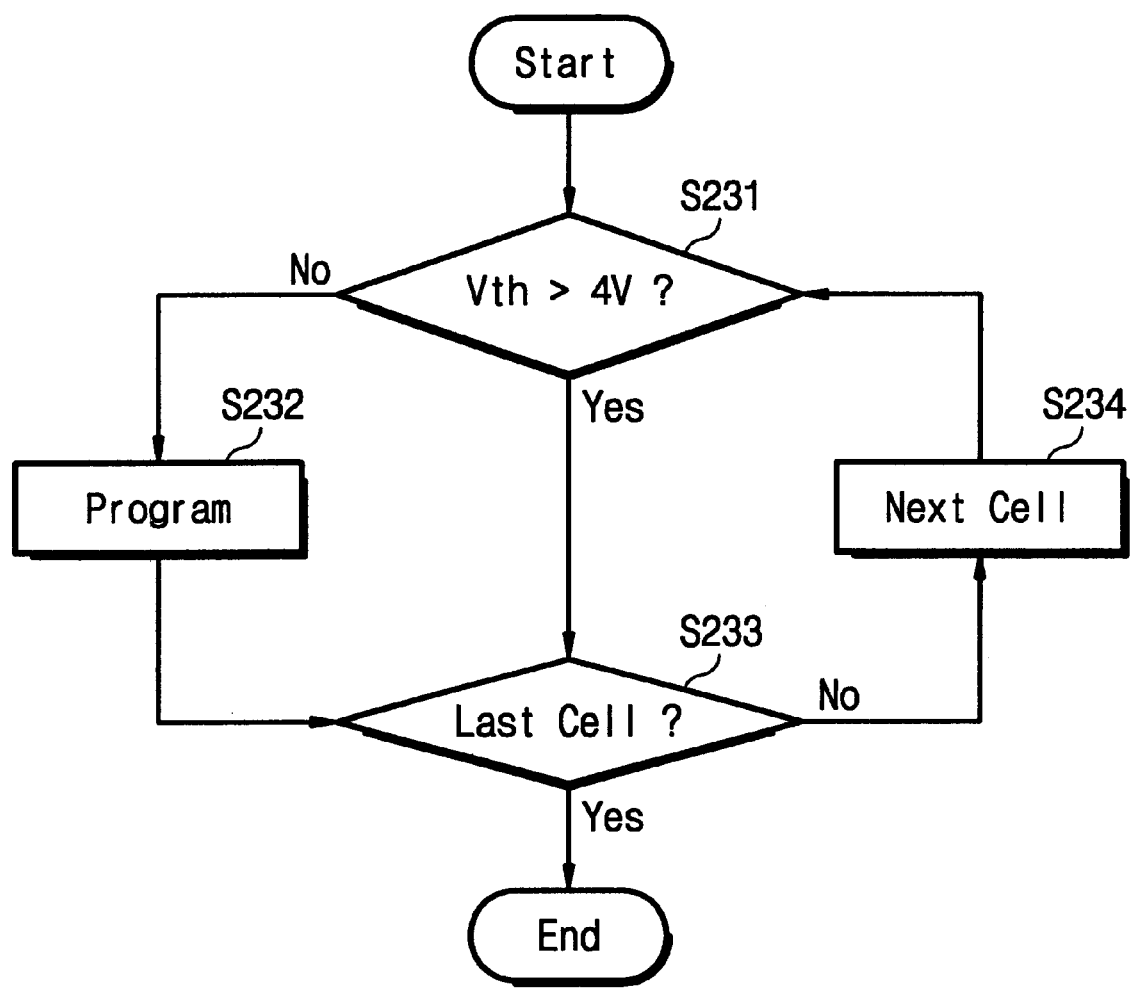
FIGS. 8A and 8B are flow charts showing various embodiments of the intermediate program operations of the erasure method of FIG. 6.

If a memory cell is identified as a fast-erased cell, an intermediate programming operation is performed on that cell during the step S230. Referring to FIG. 8A, during the intermediate programming step S230, erased cells having threshold voltages less than the check voltage are re-programmed with threshold voltages higher than the check voltage. More specifically, a verification step S231 first determines whether the present erased cell has a threshold voltage higher than the check voltage. If that cell has a threshold voltage lower than the check voltage, it is regarded as a fast-erased cell and is passed onto a Program step S232. In the Program step S232, a programming operation is performed on the fast-erased cell to increase its threshold voltage. If an erased cell has a threshold voltage higher than the check voltage, the process proceeds to the next cell.

Figure 8B:
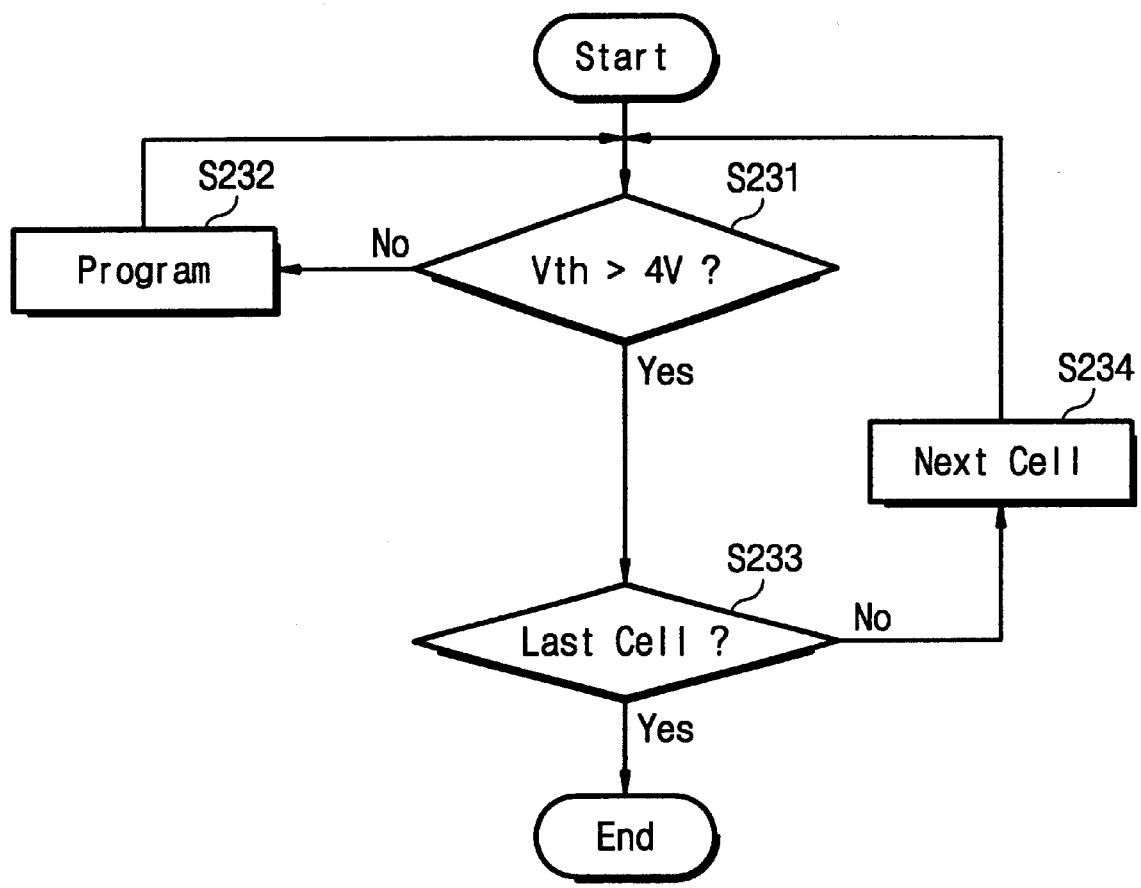
Figure 9C:
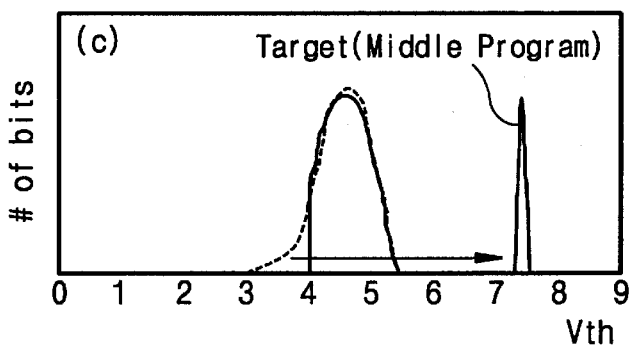
Figure 10C:
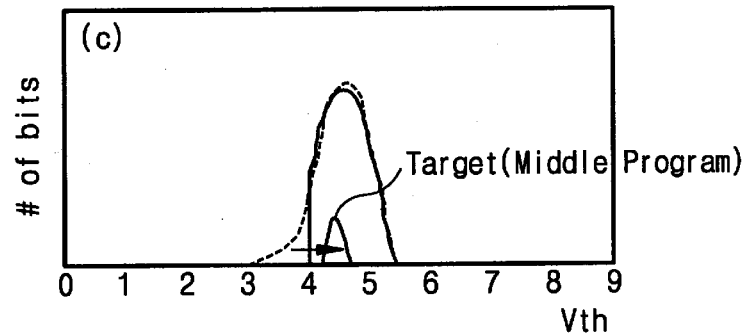

In addition to the steps illustrated in FIG. 8A, a program verification step can be provided after programming to ensure that the threshold voltage of the fast-erased cell is raised above the check voltage. FIG. 8B illustrates modification of the process of FIG. 8A to include a verification loop. Referring to FIG. 8B, a verification loop causes the erased cell to be repeatedly programmed until its voltage is above the check voltage. This is accomplished by modifying the sequential flow of the process illustrated in FIG. 8A, such that the programming step S232 is followed by the verifying step S231, rather than the last cell check step S233. Referring to FIGS. 9C and 10C, as a result of the intermediate programming operations described above, the threshold voltages of each of the fast-erased cells is increased to above the check voltage.

Figure 9D:
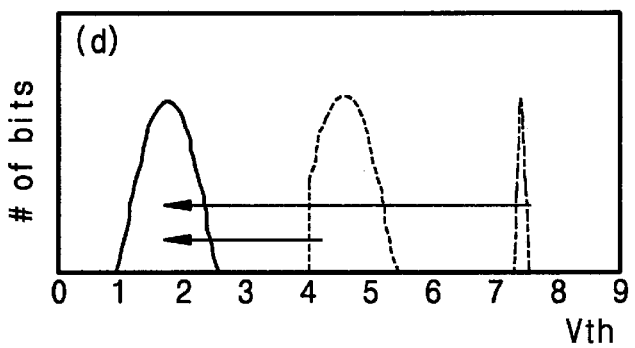
Figure 10D:
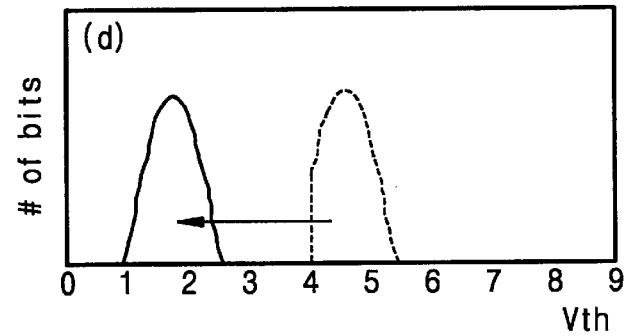

Returning to FIG. 7, following the intermediate programming operation S230, the second erasing operation S240 is performed on each of the memory cells, including those that were erased and re-programmed during the first Erasure step S210 and Intermediate Program step S220. The second Erasure step S240 is performed using the erasing biasing voltages shown in Table 1. After completing this step, a verification step S250 performs a verifying operation to determine whether the memory cells have threshold voltages less than a maximum allowable erased cell threshold voltage (e.g., 3V). If any of the memory cells has a threshold voltage higher than 3V, the process returns to the second erasing step S240. The Main Erasure process S200 is completed only when all of the memory cells have a threshold voltage less than the predetermined maximum erased cell voltage level. The resulting voltage distribution profile is shown in FIGS. 9D and 10D.

Figure 12:
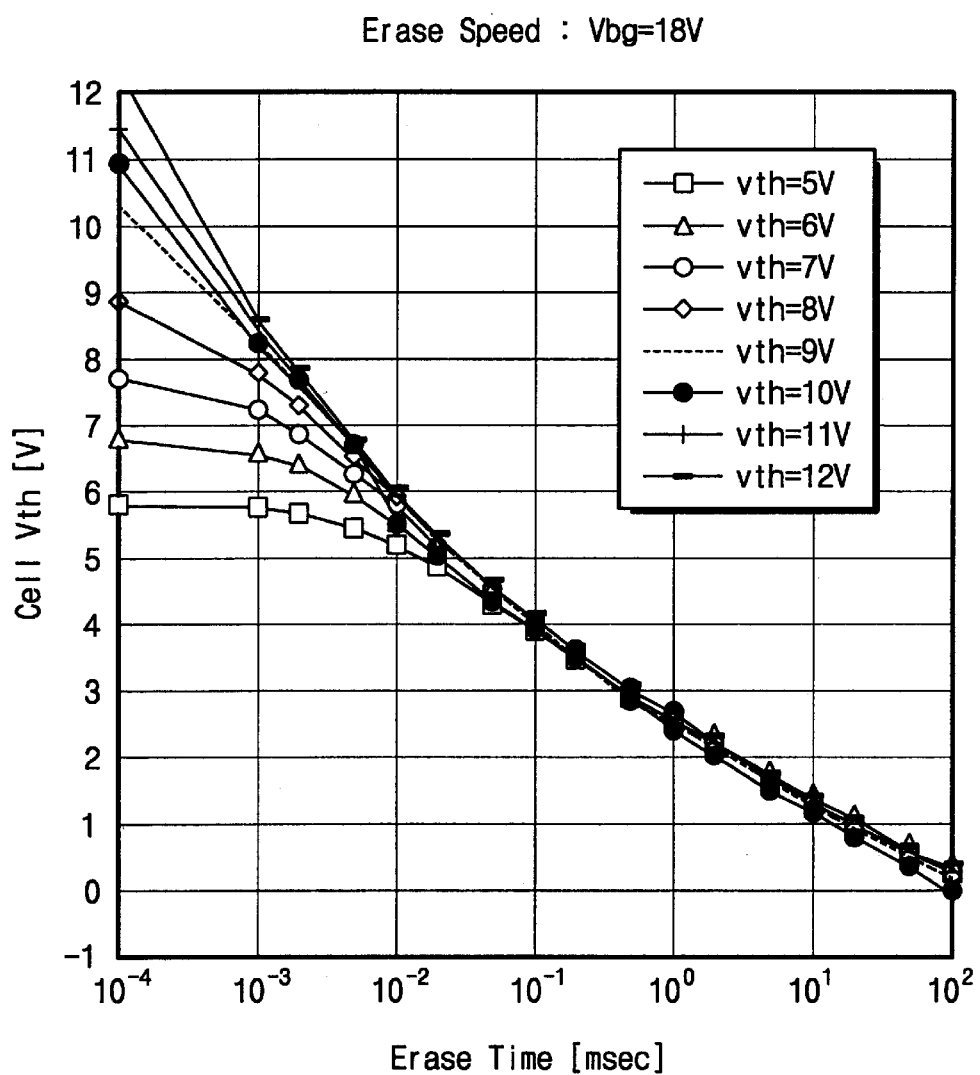
FIG. 12 is a graph showing the relationship between erasure time and threshold voltage during an erasure operation on memory cells having different beginning threshold voltages and different erasing speeds.

FIG. 12 is a graph illustrating the relationship between threshold voltages and erasure time for cells with various erasing speeds. Referring to FIG. 12, the initial threshold voltages of the cells have been modified through intermediate programming. The intermediate programming operation, can, for example, raise the threshold voltages of fast-erased cells to between 5V to 12V. As illustrated by FIG. 12, memory cells having different initial threshold voltages are nearly equalized to a uniform threshold voltage level as the erasure time passes. This is because the initial threshold voltages have been modified through the intermediate programming operation such that cells with faster erasing speeds have higher initial threshold voltages. More specifically, because the higher initial voltages correspond to faster erasing speeds and the lower initial voltages correspond to slower erasing speeds, the threshold voltages tend to become uniform during the erasing process. The threshold voltages of this example approach a uniform level in an erasure time of about 100 $\mu$s.

Figure 13:
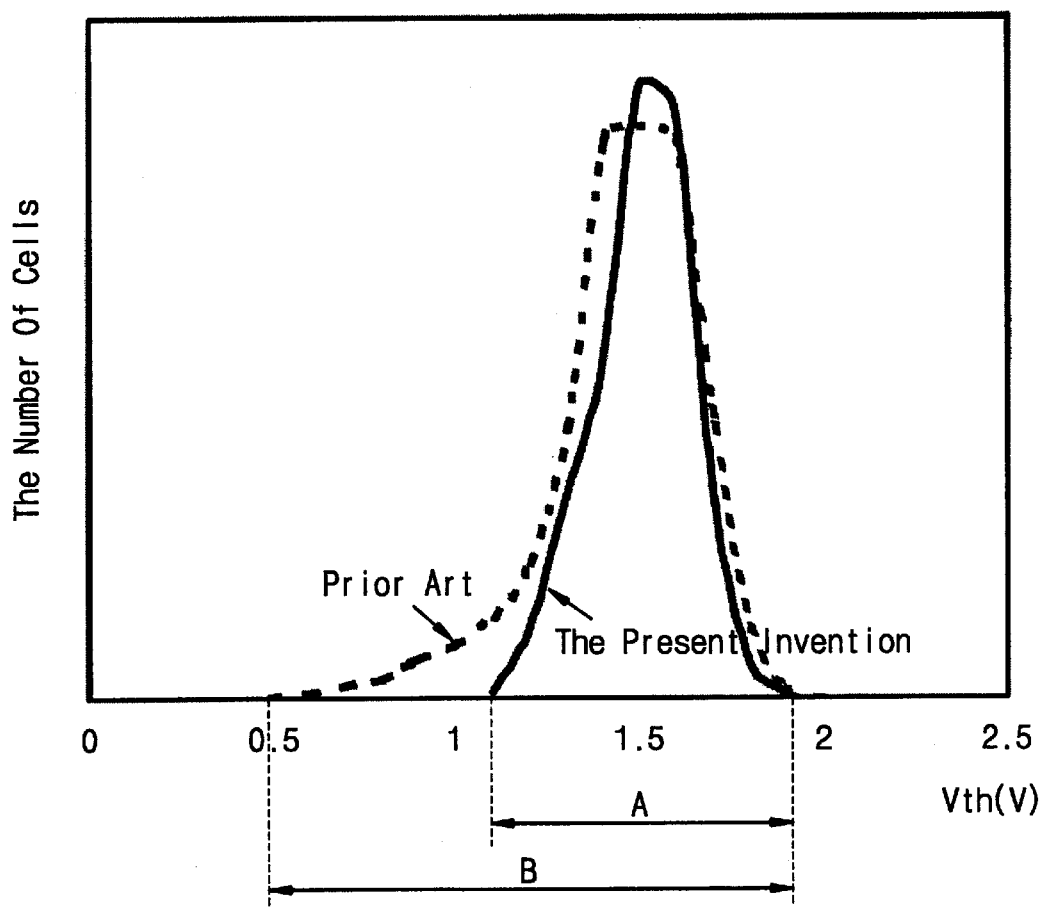
FIG. 13 is a graph comparing a threshold voltage distribution profile of flash memory cells erased using the conventional method of FIG. 3 with a voltage distribution profile of flash memory cells erased according to the method of FIG. 6.

FIG. 13 presents a graphic comparison of the erased state threshold voltage distribution profile of a flash memory sector erased according to the prior art method with that of a flash memory sector erased according to the above-described embodiments of the invention. As illustrated by FIG. 13, the erasing process of the preferred embodiments of this invention raises the lower edge of the distribution profile up to about 1V by increasing the threshold voltage levels of the fast-erased cells. In this manner, the active width A of the distribution profile according to this invention is narrower than the active width B of the distribution profile according to the prior art.

The erasure process of this invention has been described in terms of various preferred implementations and embodiments. The aforementioned embodiments may be modified in arrangement, sequence, and detail without departing from the spirit or scope of the appended claims. In one such variation, the main erasing operation may include additional intermediate programming steps. For example, the Main Erasure step S200, illustrated in FIG. 7, may be modified to include a second intermediate program step. In this case, the main erasing process would proceed in the following sequence: a first erasing step, a first intermediate program step using a first check voltage, a second erasing step, a second intermediate program step using a second check voltage, and a third erasing step. In addition, although the presently preferred erasure methods do not include a post-programming step, post-programming may also be performed, if desired.

The various embodiments of the present invention described above provide a narrower active width of a threshold voltage distribution profile after erasing, thereby enhancing the stability and reliability of erased memory cells. A few of the significant advantages offered by these embodiments over the prior art are summarized below.

First, by shifting the threshold voltages of the fast-erased cells towards the effective region of the threshold voltage distribution profile, the preferred embodiments of the present invention prevent program or read-out fail due to over-erased cells being regarded as on-cells. Second, a total erasure time for memory cells is shortened, because intermediate programming does not require a program verifying operation. In addition, intermediate programming utilizes bias voltages (e.g., wordline voltage) higher than those employed in the prior art post-programming technique which also reduces the required programming time.

Third, a program speed is enhanced so that the overlapping area between the floating gate 22 and drain regions 16 can be extended. An increase in this overlapping area magnifies a drain coupling ratio (Rd=$C_{drain}/(C_{ono}+C_{tunnel})$) and the floating gate voltage Vf, thereby reducing the abnormal drain turn-on. Fourth, these methods can be applied to extended applications such as multi-bit storage because the distribution profile of the threshold voltages can be readily controlled.

While this invention has been described in connection with what is presently considered to be the most practical and preferred embodiments, the invention is not limited to the embodiments disclosed, but, should be interpreted to cover each of the various modifications and equivalent arrangements that fall within the spirit of the following claims.

What is claimed is:

1. A method of preventing over-erasing of a fast-erased memory cell in a flash memory, comprising:
   detecting a fast-erased memory cell in a sector of a flash memory before a main erasing operation, wherein said sector comprises a plurality of memory cells;
   programming the detected fast-erased memory cell with a threshold voltage above a predetermined threshold voltage; and
   performing the main erasing operation on all of the memory cells in the sector.

2. A method of preventing over-erasing of a fast-erased memory cell in a flash memory, comprising:
   detecting a fast-erased memory cell in a sector of a flash memory, wherein said sector comprises a plurality of memory cells;
   programming the detected fast-erased memory cell with a threshold voltage above a predetermined threshold voltage; and
   performing a main erasing operation on all of the memory cells in the sector;
   wherein detecting a fast-erased memory cell comprises:
      performing a first erasing operation on each of the memory cells in the sector;
      determining a first threshold voltage of each of the memory cells after the first erasing operation; and
      comparing the first threshold voltage of each of the memory cells to a first check voltage.

3. A method according to claim 2, wherein detecting a fast-erased memory cell further comprises classifying memory cells having first threshold voltages less than the first check voltage as fast-erased memory cells.

4. A method according to claim 2, wherein performing a first erasing operation comprises performing the first erasing operation for a predetermined period of time less than an amount of time for a main erasing operation.

5. A method according to claim 2, wherein the check voltage is approximately four volts.

6. A method according to claim 2, wherein detecting a fast-erased memory cell further comprises:
   performing a second erasing operation on each of the memory cells in the sector;
   determining a second threshold voltage of each of the memory cells after the second erasing operation;
   comparing the second threshold voltage of each of the memory cells with a second check voltage; and
   classifying memory cells having first and second threshold voltages less than the first and second check voltages, respectively, as fast-erased memory cells.

7. A method according to claim 1, further comprising performing a post-programming step to raise the level of any over-erased memory cell above a predetermined threshold voltage.

8. A method according to claim 1, wherein programming the detected fast-erased memory cell with a threshold voltage above a predetermined threshold voltage comprises:
   performing a first intermediate programming operation to raise the threshold voltage of the fast-erased memory cell above the predetermined threshold voltage; and
   performing a program verification operation to ensure that the threshold voltage is above the predetermined threshold voltage.

9. A method according to claim 1, wherein performing a main erasing operation on all of the memory cells in the sector comprises:
   performing an erasing operation on all of the memory cells in the sector; and
   performing a verifying operation to ensure that each of the threshold voltages are less than a maximum erased cell voltage level.

10. A method comprising:
    performing a first erasing operation on each of a plurality of memory cells in a sector;
    detecting fast-erased ones of the memory cells by determining which of the memory cells have threshold voltages less than a check voltage;
    programming the fast-erased memory cells; and
    erasing all of the memory cells in the sector.

11. A method according to claim 10, further comprising performing a program verify operation to ensure that the fast-erased memory cells are programmed with a threshold voltage above the check voltage.

12. A method according to claim 10, wherein the check voltage is about four volts.

13. A method according to claim 10, further comprising a erasure verifying operation to ensure that each of the memory cells in the erased sector have a threshold voltage less than a predetermined maximum voltage level for an erased memory cell.

14. A method according to claim 12, wherein the predetermined maximum voltage level is about three volts.

15. A method comprising:
    performing a first erasing operation on a plurality of memory cells forming a sector;
    determining whether the memory cells have threshold voltages less than a first check voltage in order to detect fast-erased memory cells;
    programming only the fast-erased memory cells which have threshold voltages less than the first check voltage;
    performing a second erasing operation on all of the memory cells in the sector; and
    determining whether the memory cells have threshold voltages less than a second check voltage.

16. A method according to claim 15, further comprising programming only the memory cells which have threshold voltages less than the second check voltage.

17. A method according to claim 16, further comprising performing a third erasing operation.

18. A method according to claim 15, further comprising performing an erasure verifying operation to ensure that the threshold voltage of each of the memory cells is below a maximum predetermined voltage level of an erased memory cell.

19. A method according to claim 15, further comprising performing a post-programming operation to raise the threshold voltage of any over-erased memory cells above a predetermined threshold voltage.

20. A method of controlling an active width of an erased voltage distribution profile in a sector of a flash memory, comprising:

identifying fast-erased memory cells out of a plurality of memory cells in a flash memory sector by performing a first erasing operation on the plurality of memory cells to test for fast-erased memory cells;

performing an intermediate programming operation on only the fast-erased memory cells to raise a threshold voltage of the fast-erased memory cells to above a predetermined threshold voltage; and performing a main erasing operation on all of the memory cells in the sector.

* * * * *